United States Patent [19]
Leonowich

[11] Patent Number: 5,254,881
[45] Date of Patent: Oct. 19, 1993

[54] MASTER-SLAVE PEAK DETECTOR

[75] Inventor: Robert H. Leonowich, Muhlenberg Township, Berks County, Pa.

[73] Assignee: AT&T Bell Laboratories, Murray Hill, N.J.

[21] Appl. No.: 760,643

[22] Filed: Sep. 16, 1991

[51] Int. Cl.⁵ .................. H03K 5/153; G01R 19/04
[52] U.S. Cl. .................. 307/351; 307/353; 307/491; 307/494
[58] Field of Search .............. 307/351, 353, 491, 494; 328/151

[56] References Cited

U.S. PATENT DOCUMENTS

| | | |
|---|---|---|
| 3,639,786 | 2/1972 | Lovelace. |
| 3,885,168 | 5/1975 | Matsuzaki ............... 307/351 |
| 4,185,211 | 1/1980 | Kucharewski. |
| 4,321,488 | 3/1982 | Srivastava. |
| 4,389,579 | 6/1983 | Stein. |
| 4,420,698 | 12/1983 | Raadsen ................. 307/351 |
| 4,613,769 | 9/1986 | Gross et al. ............. 307/351 |
| 4,720,643 | 1/1988 | Embree et al.. |
| 4,987,323 | 1/1991 | Fujita .................... 307/353 |
| 5,025,176 | 6/1991 | Takeno ................... 307/351 |

FOREIGN PATENT DOCUMENTS

219871 9/1986 Japan.

OTHER PUBLICATIONS

"Amplitude Measurement Circuits", *IBM Technical Disclosure Bulletin*, vol. 17 No. 8 Jan. 1975, J. W. Allen, pp. 2429, 2430.
"High Speed Peak Detector", *IBM Technical Disclosure Bulletin*, vol. 21 No. 9 Feb. 1979, J. E. Cunningham, Jr., pp. 3544, 3545.
"Low Offset Peak Detector Circuit Uses Transistors", *Electronic Engineering* Mid Oct. 1977, J. Hawke, p. 23.

Primary Examiner—John Zazworsky
Attorney, Agent, or Firm—Scott W. McLellan

[57] ABSTRACT

A peak detector for rapidly following the peak voltage of a pulsed input signal without significant droop between pulses. The peak detector has a master section which selectively controls the droop rate of a slave section. The output of the slave section is the output of the peak detector. The master section droop is determined by a resistor, which may be disconnected therefrom to hold the peak of the input signal.

7 Claims, 2 Drawing Sheets

MASTER-SLAVE PEAK DETECTOR

BACKGROUND OF THE INVENTION

1. Field of the Invention

This invention relates generally to a circuit for capturing the peak value of an electrical signal and, more particularly, to such circuits disposed in a semiconductor integrated circuit.

2. Description of the Prior Art

Data communications equipment generally rely on a decision circuit to ascertain if the signal (symbol or character) transmitted is one of a plurality of predetermined values, such as a logical "one" or a logical "zero". Accurately establishing the decision threshold (or thresholds) is of critical importance so that error free demodulation occurs.

In burst mode communication systems where "packets" of data may be sent to a receiver from multiple transmitters, the establishment of the thresholds must be done for each received packet and as fast as possible so that a minimum of the information transmitted is demodulated incorrectly. A data "packet" typically includes a preamble, containing no data, which is typically considered as overhead for the communication system. The preamble is used to synchronize the receiver to the packet. The synchronization can occur only after valid demodulation of the preamble occurs. Hence, to minimize the length of the preamble, the time spent establishing a valid threshold should be minimized. Similarly, once the threshold has been established, the threshold should not change appreciably between packets (dead time) yet follow the amplitude changes in the received packets.

To establish the thresholds, a peak detector circuit is used to capture and hold the peak value of an input signal. The peak value of the signal is then subdivided in a predetermined manner to categorize the received signal into one of the plurality of predetermined values.

Similarly, peak detectors may be used in the read channel and head positioning circuitry in mass storage systems. The peak detector must rapidly follow the amplitude of signals from a read head as the head moves from sector to sector or track to track. However, the held peak value of the read data should not change appreciably when the head so moves and no data is being read.

The peak detector may also be used to control the gain of an amplifier to provide a substantially constant output amplitude of a signal amplified by the amplifier. To minimize any overshoot of the amplified signal, the peak value thereof must be ascertained as quickly as possible. Further, the peak detector should hold that value for a predetermined amount of time when the signal is removed while rapidly following the changes in the amplitude of the signal if the signal is still present.

SUMMARY OF THE INVENTION

It is therefore desirable, as one aspect of the invention, to provide a peak detector circuit having very fast response time with good accuracy.

It is also desirable to provide a peak detector circuit with a predetermined droop rate during periods between input pulses while providing a very fast response time to variations in the peaks of the input pulses.

These and other aspects of the invention may be accomplished generally with a peak detector characterized by having a slave section and a master section. The slave section, having an output and being responsive to an input signal, holds the peak of the input signal. The master section, also responsive to the input signal, selectively causes the output of the slave section to droop.

Alternatively, the invention may be accomplished generally in a peak detector, responsive to an input signal and having a first capacitor, for holding the peak of the input signal across the first capacitor. The peak detector includes a second capacitor and a switch, responsive to the input signal, for selectively coupling the second capacitor to the first capacitor. This allows for the selective droop of the held peak value on the first capacitor by the selective coupling of the second capacitor.

BRIEF DESCRIPTION OF THE DRAWING

The foregoing features of this invention, as well as the invention itself, may be more fully understood from the following detailed description of the drawings, in which.

Detailed Description

Figure 1:
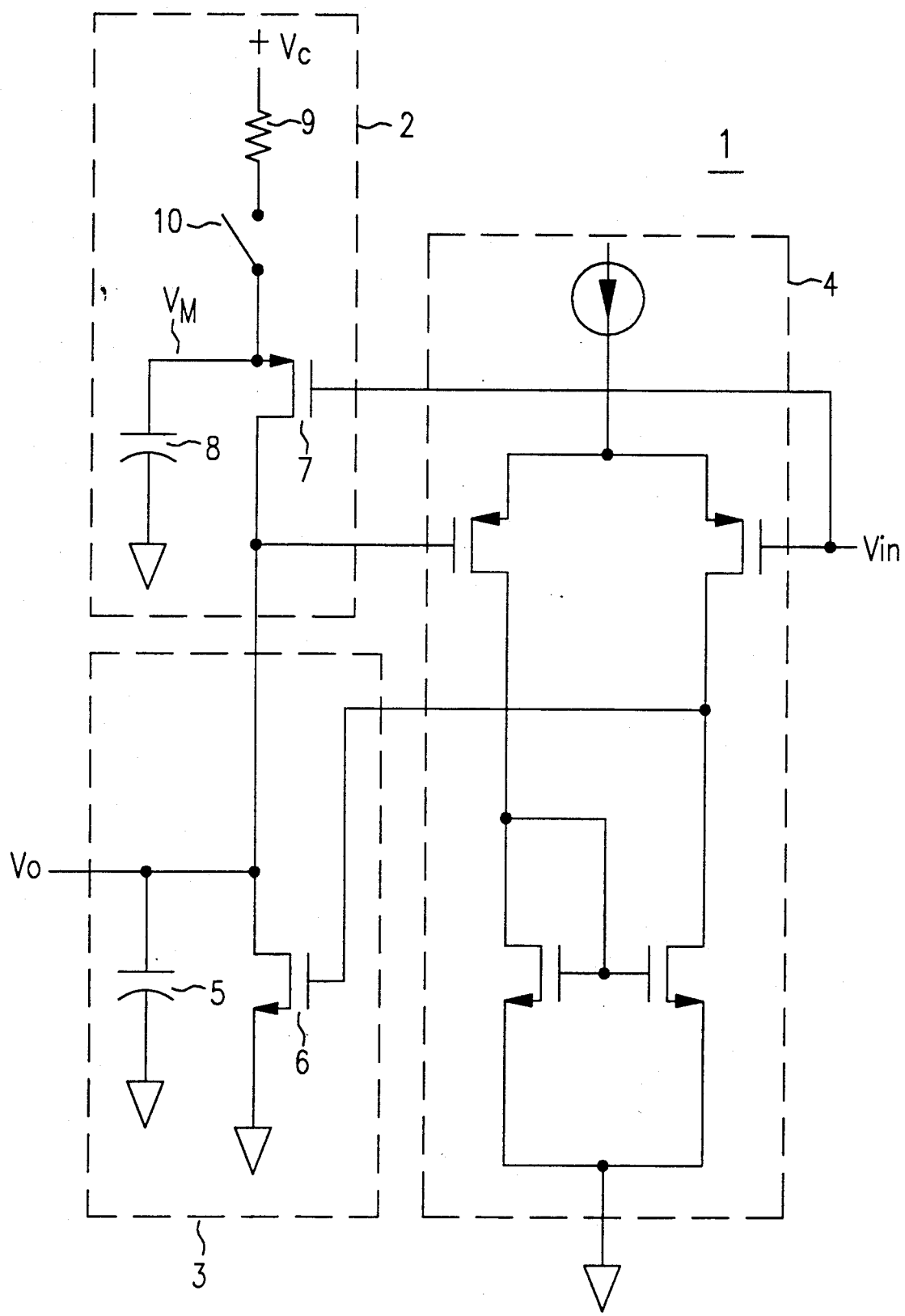
FIG. 1 is a simplified schematic drawing of an embodiment of a peak detector according to one aspect of the invention; and, FIG. 2 is a simplified schematic drawing of another embodiment of a peak detector according to another aspect of the invention.

An exemplary embodiment of the invention is shown in FIG. 1. In summary, a peak detector 1 has a master section 2 and a slave section 3. The slave section 3 holds the peak value of an input signal applied to the input Vin. The master section 2 selectively droops the held peak value in response to the input signal on input Vin.

The peak detector 1 may also be thought of as being a conventional peak detector having a comparator 4 and slave section 3. A first capacitor 5 holds the peak value of the input signal applied to input Vin. The peak value is dropped by transistor 7, acting as a switch, selectively coupling second capacitor 8 to capacitor 5. Transistor 7 turns on when the input voltage on input Vin is less than the voltage on capacitor 8, Vm. Preferably, the threshold voltage of transistor 7, here a p-channel MOSFET, is substantially zero volts.

A more detailed description of the exemplary embodiment is given herein. For purposes of this discussion and brevity, the nodes and the voltages thereon are sometimes referred to by the same names. As stated above, the peak detector 1 has a master section 2 and a slave section 3. The slave section 3 is under the control of a comparator 4, forming a conventional peak detector. The output of the slave section 3, Vo, has thereon a voltage substantially equal to the peak voltage of the input signal applied to the input Vin. The peak voltage is held by storing a charge on capacitor 5. In the embodiment shown in FIG. 1, when the voltage of the input signal on the input Vin is less than the voltage Vo, the comparator 4 turns on, turning on transistor 6. Transistor 6 remains on until Vo and Vin are approximately the same.

To charge (droop) the voltage across capacitor 5, such as if the peaks of the input signal become smaller (less negative in this example), the master section 2 injects charge into capacitor 5. This occurs when the input (Vin) is sufficiently more negative than the voltage on capacitor 8, Vm, to turn on transistor 7. Preferably, the threshold voltage for transistor 7 is substantially zero volts.

The droop of the voltage on capacitor 8 is substantially determined by the selectively coupling of resistor 9, via switch 10, to the capacitor 8. When switch 10 is open, the peak detector 1 is in a "hold" configuration, i.e., the most negative peak is held without droop, subject to leakage currents. When switch 10 is closed, the voltage on capacitor 8 droops toward supply voltage Vc (connected to resistor 9). The voltage Vm then depends on the time constant of capacitor 8 and resistor 9. However, the droop of the output voltage, Vo, is dependent on the combined capacitances of capacitors 5 and 8 and resistor 9. (The effect of the relative capacitance of capacitors 5, 8 on the droop of the voltage on Vo will be discussed below.) In addition, the rate of droop of the output voltage on Vo is dependent not only on the variation in the amplitudes of the peaks of the input signal, but on the time between those peaks. The choice of the voltage Vc may be used to establish a minimum input threshold voltage for the master section 2. The threshold voltage assures that the input signal on Vin must be less than a minimum predetermined value for the master section 2 to couple to the slave section 3. Thus, the input signal must at least be less than the voltage Vc before the voltage on Vo can droop in this example.

The selection of the capacitance capacitors 5 and 8 depends on the application of the peak detector 1. For most operating conditions, there are three cases for selection of capacitors 5,8. First, if capacitor 5 is much bigger than capacitor 8, then the peak detector 1 can somewhat mimic a "conventional" peak detector. Second, if capacitor 8 is much larger than capacitor 5, then the droop of Vm alone substantially controls (dominates) the droop of Vo. Last, if the capacitance of capacitors 5 and 8 are roughly the same (within an order of magnitude or so) then the operation of the peak detector 1 is more complex and the droop of Vo is dependent on the combination of capacitors 5,8.

When capacitors 5,8 have roughly the same capacitance, the voltage Vm drops exponentially between input pulses. This is a result of the current from resistor 9 charging capacitor 8. When an input pulse is received that has sufficient amplitude to turn on transistor 7, then both of the voltages Vm and Vo noticeably change. If the peak of the input pulse is greater than Vo, then Vm holds the peak of the input pulse while the voltage on Vo droops toward the voltage Vm (the transistor 6 does not turn on to change Vo and transistor 7, as a source follower, forces Vm to follow the input voltage). The resulting voltage on Vo (and Vm) is easily determined by conventional methods when two capacitors, each with different voltages, are combined. If, however, the peak of the input pulse is more negative than Vo, then both Vm and Vo acquire the peak of the input signal. In either case, the voltage on Vm is now substantially different from before and a different amplitude of input pulse is then required to turn on transistor 7, restarting the above process. Thus, the behavior of peak detector 1 may be tailored for the desired application more easily than conventional peak detectors.

EXEMPLARY OPERATION

For purposes of this example, the capacitance of capacitors 5,8 are roughly the same, as discussed above. Typically, the peak detector 1 is in an "acquire" mode (switch 10 is closed), i.e., the peak detector 1 is seeking to follow the peaks of an input signal applied to Vin. Before a signal is received, the output, Vo, has a voltage of substantially Vc, the voltage of the supply connected to resistor 9. When a pulse is received on Vin, the output, Vo, quickly achieves the approximate peak voltage of the pulse due to the operation transistor 6, under the control of comparator 4. Because Vm is substantially equal to Vc in this example and the input pulse has a voltage less than Vc, transistor 7 is "on", coupling capacitors 5 and 8 together. This makes the voltage on capacitor 8, Vm, substantially equal to the voltage on Vo, the approximate peak voltage of the input pulse.

As the peak of the input pulses reduces in amplitude, the voltage on Vo changes no faster than the droop of Vm, as determined by the time constant of capacitor 8 and resistor 9, as discussed above. The voltage on Vo will then be determined by the combination of the voltages on capacitors 5 and 8. Thus, when the time between input pulses is shorter than the time constant of capacitor 8 and resistor 9, the voltage on Vo droops with decreasing input pulse peak amplitude no faster than the combination of capacitors 5 and 8 can be charged by current from resistor 9. However, when the time between pulses is longer than the above-mentioned time constant, the voltage on Vm droops more, allowing for faster acquisition of a reduced input pulse amplitude.

When switch 10 is opened, the detector 1 is placed in the "hold" mode, as discussed above. In this mode, ideally, the voltages Vm and Vo are substantially the same and hold the peak input voltage. The voltage on Vo and Vm will continue to hold that voltage until the switch 10 is closed, ignoring leakage. It is understood, however, that the peak detector 1 will continue to adjust the output voltage on Vo if a greater peak amplitude signal (pulse) is received.

An peak detector 1 using an exemplary capacitance of 3 to 12.5 pF for capacitor 5, 2 to 8.4 pF for capacitor 8, and an exemplary resistance of 10 KΩ for resistor 9 has been fabricated. This detector 1 has been used in the read channel for a fixed disk memory system. It may be advantageous to allow for varying the capacitances of capacitors 5 and 8 and the resistance of resistor 9 depending on the nature of the input signals, e.g., the type and maximum frequency of the input signals, the expected variation in signal amplitude, time between groups of signals or bursts of pulses, etc.

Figure 2:
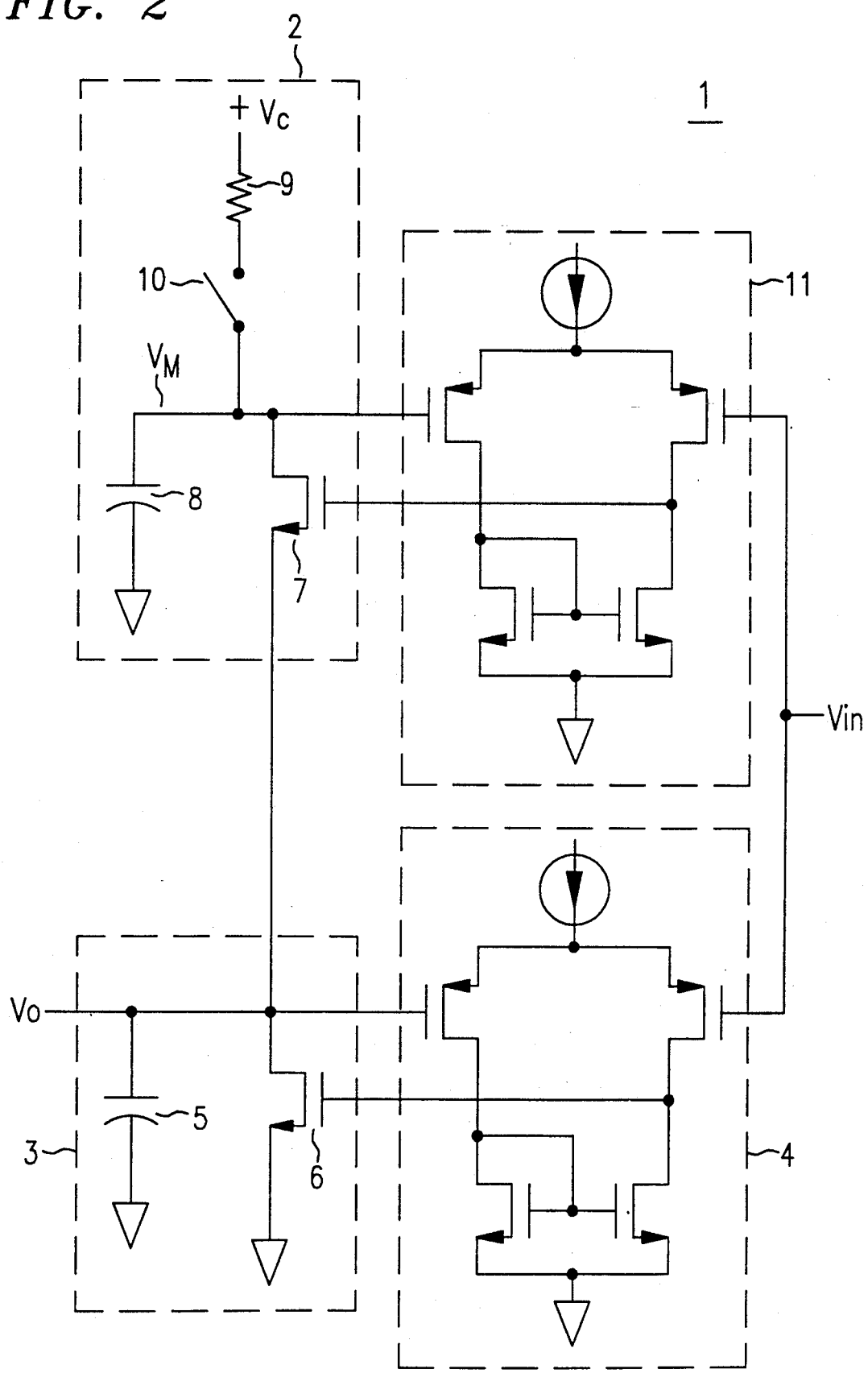

An alternative embodiment is shown in FIG. 2. This embodiment is similar to that shown in FIG. 1. expect that another comparator 11 controls the operation of master section 2. Therefore, transistor 7 is shown as an n-channel FET instead of a p-channel FET as in FIG. 1. This configuration for a peak detector 1 allows for variation in the threshold voltage of transistor 7 when determining when transistor 7 turns on to couple capacitors 5 and 8 together, as discussed above.

While the foregoing exemplary embodiment is shown using MOSFETs, it is understood that an all-bipolar transistor, or a combination of bipolar and MOSFET (BiMOS), design can be used.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. A peak detector having a first capacitor, formed in an integrated circuit and responsive to an input signal, for holding the peak of the input signal across the first capacitor, characterized by:
   a second capacitor;
   a switch, responsive to the input signal, for selectively coupling the second capacitor to the first capacitor;
   wherein the switch includes a comparator and an FET, the comparator being responsive to the input signal and the voltage on the second capacitor, and the FET coupling the first capacitor to the second capacitor in response to the comparator when the input signal differs a predetermined amount from the voltage on the second capacitor.

2. The peak detector as recited in claim 1, further characterized by:
   means for changing the voltage on the second capacitor.

3. The peak detector as recited in claim 2, wherein the means is a resistor.

4. The peak detector as recited in claim 1, wherein the switch is an FET having a substantially zero voltage threshold.

5. A peak detector having a first capacitor, formed in an integrated circuit and responsive to an input signal, for holding the peak of the input signal across the first capacitor, characterized by:
   a second capacitor;
   means for changing a voltage on the second capacitor; and
   a switch, responsive to the input signal and connected between the first capacitor and the second capacitor, for coupling the first capacitor to the second capacitor when the input signal differs a predetermined amount from the voltage on the second capacitor;
   wherein the first capacitor is decoupled from the second capacitor and the voltage on the first capacitor is independent of the second capacitor voltage unless the switch so couples the capacitors.

6. The peak detectors as recited in claim 5, wherein the switch is an FET with a source connected to the second capacitor, a drain connected to the first capacitor, and a gate having the input signal coupled thereto, the FET having a substantially zero threshold voltage.

7. The peak detector as recited in claim 6, wherein the means is a resistor.

* * * * *